(12) United States Patent
Kuo et al.

(10) Patent No.: US 7,924,209 B2
(45) Date of Patent: Apr. 12, 2011

(54) SELF-CALIBRATION CIRCUIT AND METHOD FOR CAPACITORS

(75) Inventors: Kuo-Jen Kuo, Taipei (TW); Kang-Shou Chang, Taipei (TW); Yu-Lung Hung, Taipei (TW)

(73) Assignee: Prolific Technology Inc., Taipei (TW)

( * ) Notice: Subject to any disclaimer, the term of this patent is extended or adjusted under 35 U.S.C. 154(b) by 63 days.

(21) Appl. No.: 12/478,785

(22) Filed: Jun. 5, 2009

(65) Prior Publication Data

US 2010/0201552 A1 Aug. 12, 2010

(30) Foreign Application Priority Data

Feb. 9, 2009 (TW) .............................. 98104032 A

(51) Int. Cl.
*H03M 1/12* (2006.01)
(52) U.S. Cl. ....................... 341/172; 341/118
(58) Field of Classification Search .................. 341/172, 341/155, 156, 110, 118, 120, 121, 132, 150, 341/139, 161, 162, 163
See application file for complete search history.

(56) References Cited

U.S. PATENT DOCUMENTS

| 4,709,225 A | 11/1987 | Welland et al. |
| 5,235,335 A | 8/1993 | Hester et al. |
| 7,170,439 B1 * | 1/2007 | Chen .............................. 341/172 |

FOREIGN PATENT DOCUMENTS

TW       I231098       4/2005

* cited by examiner

*Primary Examiner* — Joseph Lauture
(74) *Attorney, Agent, or Firm* — Jianq Chyun IP Office

(57) ABSTRACT

A self-calibration circuit and method for capacitors are provided. A capacitor array is calibrated to approximate a reference capacitor according to an average parameter generated by calibrating the capacitor array multiple times. Since the capacitance of the compensation capacitor required to be connected to the target capacitor in parallel is determined according to the average parameter generated by performing the calibration multiple times, the error caused by a single calibration can be reduced, and meanwhile the calibration error caused by a reference voltage error or noise is reduced.

9 Claims, 5 Drawing Sheets

SELF-CALIBRATION CIRCUIT AND METHOD FOR CAPACITORS

CROSS-REFERENCE TO RELATED APPLICATION

This application claims the priority benefit of Taiwan application serial no. 98104032, filed on Feb. 9, 2009. The entirety of the above-mentioned patent application is hereby incorporated by reference herein and made a part of this specification.

BACKGROUND OF THE INVENTION

1. Field of the Invention

The present invention relates to a self-calibration circuit for capacitors. More particularly, the present invention relates to a self-calibration circuit for capacitors capable of reducing a calibration error caused by a reference voltage error.

2. Description of Related Art

A successive approximation type analog to digital converter (ADC) generally has an accurate resistor array or capacitor array, and the resistors or capacitors are generally arranged based on a binary-weighted approach. Taking the capacitors as an example, besides the capacitor of the most significant bit, a capacitance of each capacitor is a half of the capacitance of another capacitor in a descending order, so as to form a binary-weighted capacitor array. If the capacitance is inaccurate, a dynamical non-linearity error of the ADC is increased accordingly, which may lead to conversion errors between analog signals and digital signals.

During the fabrication process of an integrated circuit, an accuracy of a capacitor can only reach about 10 bits, and if the accuracy is required to be improved, a general method thereof is to modify the capacitor error to the minimum through multiple fabrication processes, or to calibrate the capacitance of the capacitor by laser trimming. However, such methods are expensive and time-consuming.

Therefore, in the related art, a self-calibration method is applied for calibrating the capacitor array, by which compensation capacitors corresponding to individual capacitor error are set in the capacitor array, and then the capacitances are compared according to a reference voltage and a reference capacitor, so as to determine the capacitance to be compensated. However, during the calibration process, if the reference voltage is inaccurate or has excessive noise, the calibration error is occurred, and the dynamical non-linearity error of the ADC is enlarged.

SUMMARY OF THE INVENTION

The present invention is directed to a self-calibration circuit and a method for capacitors, by which an average of compensation capacitors is obtained by repeatedly performing a capacitor calibration procedure for multiple times, so as to reduce a calibration error caused by a reference voltage error.

Accordingly, the present invention provides a self-calibration circuit for capacitors, which includes a reference capacitor, a capacitor array, a calibration circuit and a counting unit. The reference capacitor is coupled between a common terminal and a first input terminal, and the capacitor array includes a target capacitor and a plurality of compensation capacitors, wherein the target capacitor is coupled between the common terminal and a second input terminal, one ends of the compensation capacitors are coupled to the common terminal, and other ends of the compensation capacitors are coupled to a first switch set, wherein the first switch set has a plurality of first switches respectively coupled between the compensation capacitors and the second input terminal.

The calibration circuit is coupled to the reference capacitor and the capacitor array, and the calibration circuit compares capacitances of the reference capacitor and the capacitor array to generate a parameter for determining conducting states of the first switches of the first switch set, so as to adjust a parallel connection relation between the compensation capacitors and the target capacitor, and accordingly calibrate the capacitance of the capacitor array.

The counting unit is coupled to the calibration circuit and the first switch set, and is used for temporarily store the parameter corresponding to the conducting states of the first switches, wherein the calibration circuit repeatedly compares the capacitances of the reference capacitor and the capacitor array to generate a plurality the parameters, and the counting unit accumulates the parameters and calculates an average of the parameters to output a final parameter, so as to determine the conducting states of the first switches of the first switch set for calibrating the capacitance of the capacitor array.

In an embodiment of the present invention, the calibration circuit includes a comparator, a second switch, a second switch set and a switch control circuit. A positive input terminal of the comparator is coupled to ground, and a negative input terminal of the comparator is coupled to the common terminal, the second switch is coupled between the positive input terminal and the negative input terminal of the comparator, and the second switch set is coupled among the first input terminal, the second input terminal, a reference voltage and the ground. The switch control circuit is coupled to an output terminal of the comparator, the second switch, the first switch set and the second switch set, and is used for controlling the second switch, the first switch set and the second switch set, wherein the switch control circuit generates the parameters corresponding to the conducting states of the first switches according to outputs of the comparator, so as to calibrate the capacitance of the capacitor array.

In an embodiment of the present invention, the second switch set includes a third switch and a fourth switch, wherein the third switch couples the first input terminal to the reference voltage or the ground selectively and the fourth switch couples the second input terminal to the reference voltage or the ground selectively.

In an embodiment of the present invention, the counting unit includes an accumulator register and a shift register. The accumulator register is coupled to the switch control circuit for accumulating the parameters, and the shift register is coupled between the accumulator register and the first switch set for calculating the average of the parameters, so as to output the final parameter.

In an embodiment of the present invention, the self-calibration circuit generates the parameter according to following steps. First, the first switch is conducted (turned on) to couple the positive input terminal and the negative input terminal of the comparator to the ground, and the second switch set is switched to couple the first input terminal to the reference voltage for charging the reference capacitor, and couple the second input terminal to the ground. Next, the first switch is turned off to form an open circuit, and the second switch set is switched to couple the first input terminal to the ground, and couple the second input terminal to the reference voltage for charging the target capacitor. Finally, the conducting states of the first switches are sequentially determined according to the outputs of the comparator, so as to adjust a parallel connection relation of the compensation capacitors and the target capacitor. Wherein, the conducting states of the first switches correspond to the parameter.

In an embodiment of the present invention, the capacitances of the compensation capacitors are $2^{i}*C$, wherein i is an index value of the compensation capacitors, and i is a positive integer satisfying $0 \leq i \leq (N-1)$, wherein N represents a number of the compensation capacitors, and C is a minimum capacitance in the compensation capacitors.

In another point of view, the present invention also provides a self-calibration method for capacitors, which is used for calibrating a capacitor array, so that a capacitance of the capacitor array approximates to a capacitance of a reference capacitor. The capacitor array includes a target capacitor and a plurality of compensation capacitors, and the method includes following steps: (a) comparing capacitances of the capacitor array and the reference capacitor to output a parameter; (b) adjusting a parallel connection relation between the compensation capacitors and the target capacitor according to the parameter, so as to calibrate the capacitance of the capacitor array; (c) repeating the steps (a) and (b) to generate a plurality of parameters; (d) accumulating the parameters and calculating an average of the parameters to output a final parameter; and (e) determining the parallel connection relation between the compensation capacitors and the target capacitor according to the final parameter.

According to the above descriptions, in the present invention, the capacitor array is calibrated according to the average parameter generated by multiple capacitor calibrations, so that the capacitor array approximates to a required reference capacitor. Since the capacitance of the compensation capacitor required to be connected to the target capacitor in parallel is determined according to the average parameter generated by performing the calibration multiple times, the error caused by a single calibration can be reduced, and meanwhile the calibration error caused by a reference voltage error or noise is reduced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1:
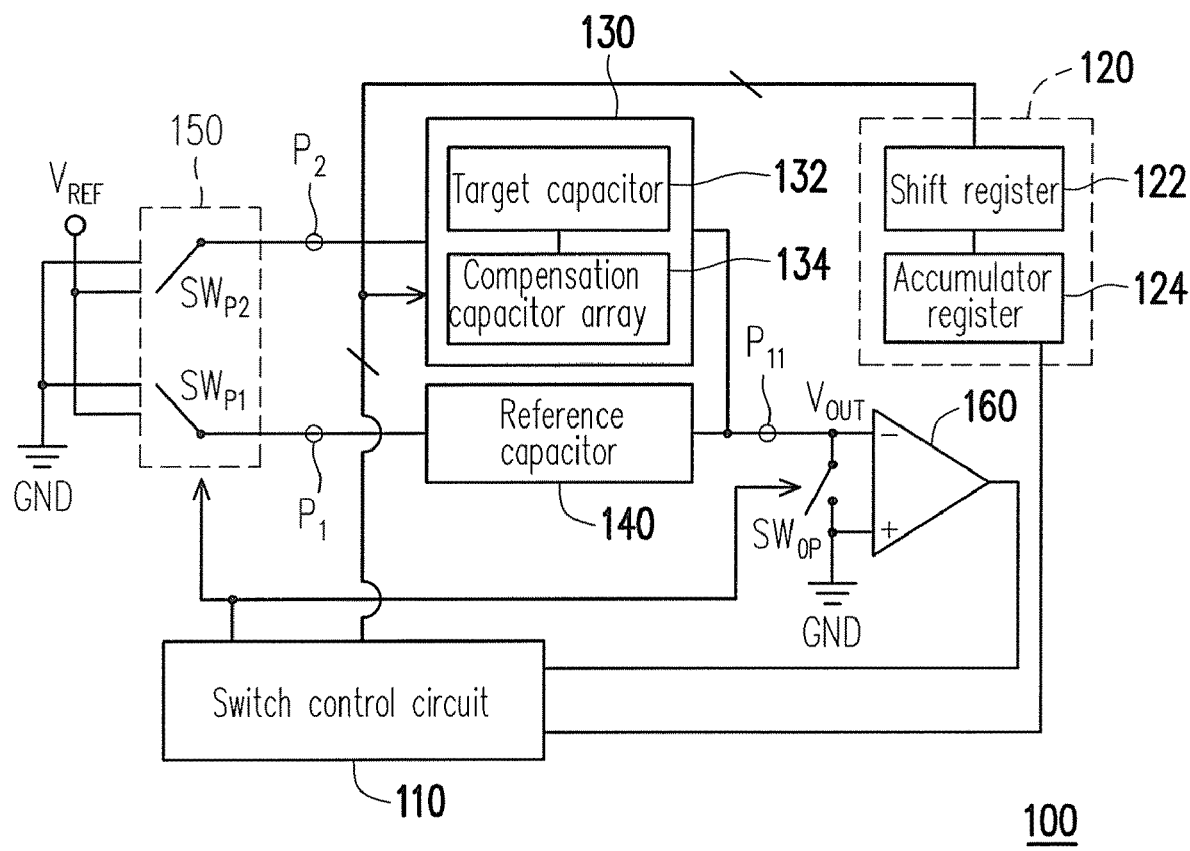
FIG. 1 is a diagram illustrating a self-calibration circuit for capacitors according to a first embodiment of the present invention.

Referring to FIG. 1, FIG. 1 is a diagram illustrating a self-calibration circuit for capacitors according to the first embodiment of the present invention. The self-calibration circuit 100 includes a switch control circuit 110, a counting unit 120, a capacitor array 130, a reference capacitor 140, a switch set 150, a comparator 160 and a switch $SW_{OP}$. The capacitor array 130 includes a target capacitor 132 and a compensation capacitor array 134, wherein the compensation capacitor array 134 includes a plurality of compensation capacitors (not shown) for connecting to the target capacitor 132 in parallel, so as to calibrate a capacitance of the capacitor array 130. The switch set 150 includes switches $SW_{P1}$ and $SW_{P2}$. One end of the reference capacitor 140 is coupled to a common terminal $P_{11}$, and another end of the reference capacitor 140 is coupled to a first input terminal $P_1$. One end of the target capacitor 132 is coupled to the common terminal $P_{11}$, and another end of the target capacitor 132 is coupled to a second input terminal $P_2$. One end of the compensation capacitor array 134 is also coupled to the common terminal $P_{11}$, and another end of the compensation capacitor array 134 is coupled to the second input terminal $P_2$ through a switch (not shown).

A positive input terminal of the comparator 160 is coupled to the ground GND, a negative input terminal thereof is coupled to the common terminal $P_{11}$, and an output terminal of the comparator 160 is coupled to the switch control circuit 110. The switch $SW_{OP}$ is coupled between the positive input terminal and the negative input terminal of the comparator 160, and is controlled by the switch control circuit 110. One end of the switch $SW_{P1}$ of the switch set 150 is coupled to the first input terminal $P_1$, and another end thereof can be switched between the a reference voltage $V_{REF}$ and the ground GND. One end of the switch $SW_{P2}$ of the switch set 150 is coupled to the second input terminal $P_2$, and another end thereof can be switched between the reference voltage $V_{REF}$ and the ground GND. The switches $SW_{P2}$ and $SW_{P1}$ are all controlled by the switch control circuit 110. The counting unit 120 is coupled to the switch control unit 110 and the capacitor array 130, and is used for storing parameters output by the switch control circuit 110, and calculating an average of the parameters to control a parallel connection relation between the compensation capacitor array 134 and the target capacitor 132.

The switch control circuit 110 can perform a capacitor calibration procedure according to an external pulse signal or digital signal (not shown), or according to a clock signal generated in internal of the circuit. The so-called capacitor calibration procedure means that the target capacitor 132 is compensated by the capacitors in the compensation capacitor array 134, so that the capacitance of the capacitor array 130 can approximate to a capacitance of the reference capacitor 140. The switch control circuit 110 charges the reference capacitor 140 by the reference voltage $V_{REF}$ through the switch set 150, and switches the reference capacitor 140 to the ground GND after the charging, and then charges the target capacitor 132 by the reference voltage $V_{REF}$. Thereafter, the capacitances of the reference capacitor 140 and the target capacitor 132 are compared according to a voltage variation of the common terminal $P_{11}$ coupled to the reference capacitor 140 and the target capacitor 132. Then, the compensation capacitors in the compensation capacitor array 134 are coupled to the target capacitor 132 in parallel according to outputs of the comparator 160, so as to compensate the capacitance of the target capacitor 132. When the capacitance of the compensated target capacitor 132 is equal to the capacitance of the reference capacitor 140, an output voltage $V_{OUT}$ of the common terminal $P_{11}$ is equal to the ground level. Since the target capacitor 132 is equal to the reference capacitor 140, after electrical charges are averaged, the voltage level of the common terminal $P_{11}$ is equal to the ground level. The capacitance of the capacitor array 130 is a capacitance measured after the target capacitor 132 and the compensation capacitors are coupled in parallel, and the capacitance of the capacitor array 130 is mainly varied along with the capacitance of the compensation capacitor array 134 coupled to the target capacitor 132 in parallel.

Moreover, it should be noted that before the reference capacitor 140 is charged, the switch $SW_{OP}$ is conducted first for coupling the positive input terminal of the comparator 160 to the ground, and after the reference capacitor 140 is charged, the switch $SW_{OP}$ is turned off (not conducted), so that the common terminal $P_{11}$ is in a floating state. Then, the target capacitor 132 and the compensation capacitor coupled to the target capacitor 132 in parallel are charged.

The compensation capacitors in the compensation capacitor array 134 can be set according to the capacitance of the target capacitor 130 and a possible error range caused by a fabrication process, and can be arranged based on a binary-weighted approach. For example, the capacitances of the compensation capacitors are $2^{i}*C$, wherein i is an index value of the compensation capacitors, and i is a positive integer satisfying $0 \leq i \leq (N-1)$, wherein N represents a number of the compensation capacitors, and C is a minimum capacitance in the compensation capacitors. The switch control circuit 110 can seriatim couple the compensation capacitors to the target capacitor 132 in parallel according to a descending order, and base on a binary approximation method, the capacitor array 130 can approximate to the reference capacitor 140. Since during the calibration process, an equivalent capacitance measured at both ends of the target capacitor 132 can be increased due to the compensation capacitors coupled in parallel, the capacitance of the target capacitor 132 can be designed to be less than the capacitance of the reference capacitor 140.

Figure 2A:
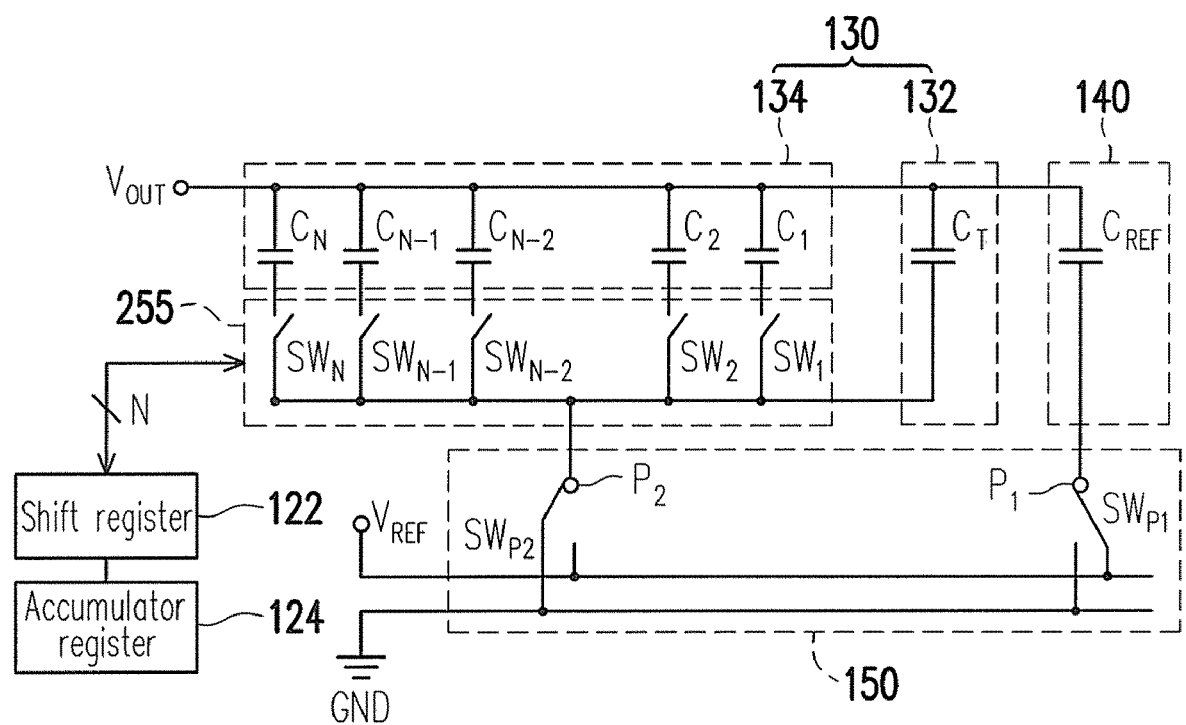
FIG. 2A is a detailed circuit diagram of a capacitor array 130 and a reference capacitor 140 according to a first embodiment of the present invention.

Next, referring to FIG. 2A for detailed circuit structures of the capacitor array 130 and the reference capacitor 140. FIG. 2A is a detailed circuit diagram of the capacitor array 130 and the reference capacitor 140 according to the first embodiment of the present invention. A part of the self-calibration circuit is illustrated in FIG. 2A, which includes the capacitor array 130, the reference capacitor 140, a shift register 122, an accumulator register 124 and the switch set 150. The capacitor array 130 includes a target capacitor $C_T$, compensation capacitors $C_1$-$C_N$ (belonged to the compensation capacitor array 134) and a switch set 255 (including switches $SW_1$-$SW_N$), wherein the switches $SW_1$-$SW_N$ are respectively coupled between the compensation capacitors $C_1$-$C_N$ and the second input terminal $P_2$. The capacitances of the compensation capacitors $C_1$-$C_N$ are in accord with the aforementioned description, wherein the capacitance of the compensation capacitor $C_N$ is C, the capacitance of the compensation capacitor $C_{N-1}$ is 2C, the capacitance of the compensation capacitor $C_{N-2}$ is 4C, and others are deduced by analogy. In the compensation capacitors $C_1$-$C_N$, the compensation capacitor $C_N$ has the minimum capacitance. The target capacitor 132 is represented by the target capacitor $C_T$, and the reference capacitor 140 is represented by the reference capacitor $C_{REF}$. The compensation capacitors $C_1$-$C_N$ are coupled to the target capacitor $C_T$ in parallel through the switches $SW_1$-$SW_N$, and the switches $SW_2$-$SW_N$ are controlled by the switch control circuit 110.

During the calibration process, the switch control circuit 110 first switches the switch $SW_{P1}$ to the reference voltage $V_{REF}$ for charging the reference capacitor $C_{REF}$, and now the switch $SW_{P2}$ is switched to the ground GND. Then, the switch $SW_{P1}$ is switched to the ground GND, and the switch $SW_{P2}$ is switched to the reference voltage $V_{REF}$ for charging the target capacitor $C_T$. Now, whether the output voltage $V_{OUT}$ is greater than 0 is determined according to an output of the comparator 160, and if the output voltage $V_{OUT}$ is greater than 0, it represents that the target capacitor $C_T$ is greater than the reference capacitor $C_{REF}$, and if the output voltage $V_{OUT}$ is less than 0, it represents that the target capacitor $C_T$ is smaller than the reference capacitor $C_{REF}$.

When the output voltage $V_{OUT}$ is less than 0, the switch $SW_1$ is first conducted for coupling the compensation capacitor $C_1$ to the target capacitor $C_T$ in parallel, so as to calibrate the equivalent capacitance of the capacitor array 130. Then, whether the output voltage $V_{OUT}$ is greater than 0 is also determined according to the output of the comparator 160, so as to determine whether the capacitance of the calibrated capacitor array 130 (i.e. the compensation capacitor $C_1$ and the target capacitor $C_T$ coupled in parallel) is equal to the reference capacitor $C_{REF}$. If the calibrated capacitor array 130 is greater than the reference capacitor $C_{REF}$, the switch $SW_1$ is then turned off (not conducted), and the switch $SW_2$ of a next stage is conducted to couple the compensation capacitor $C_2$ with a relatively small capacitance to the target capacitor $C_T$ in parallel. Thereafter, the calibrated capacitor array 130 (the compensation capacitor $C_2$ and the target capacitor $C_T$ coupled in parallel) is charged, and whether the capacitance of the calibrated capacitor array 130 is equal to the capacitance of the reference capacitor $C_{REF}$ is determined according to the output voltage $V_{OUT}$. If the calibrated capacitor array 130 is smaller than the reference capacitor $C_{REF}$, the switch $SW_1$ is maintained in a conducting state, and then the switch $SW_2$ is conducted for coupling the compensation capacitors $C_1$ and $C_2$ to the target capacitor $C_T$ in parallel, so as to calibrate the equivalent capacitance of the capacitor array 130. Deduced by analogy, the conducting states of the switches $SW_1$-$SW_N$ are sequentially determined, so that the capacitance of the capacitor array 130 can approximate to the capacitance of the reference capacitor 140.

After the calibration procedures of all of the switches $SW_1$-$SW_N$ are completed, the switch control circuit 110 generates a corresponding parameter according to the conducting states of the switches $SW_1$-$SW_N$, and the accumulator register 124 can record the parameters generated by the switch control circuit 110. Then, the switch control circuit 110 repeatedly performs the aforementioned capacitor calibration procedure to generate multiple sets of the parameter. Thereafter, the accumulator register 124 accumulates the parameters, and the shift register 122 calculates an average of the parameters to output a final parameter. In the present embodiment, since the parameter is a digital signal with N bits, a signal logic state of an individual bit can correspond to the conducting state of each of the switches $SW_1$-$SW_N$, wherein a least significant bit (LSB) in the parameter corresponds to the conducting state of the switch $SW_N$. The shift register 122 shifts an accumulation of the parameters to obtain the average of the parameters, and the counting unit 120 determines the conducting states of the switches $SW_1$-$SW_N$ according to the average, so as to calibrate the capacitance of the capacitor array 130.

In the present embodiment, since the capacitor calibration procedure is performed repeatedly to obtain the average parameter for controlling the conducting states of the switches $SW_1$-$SW_N$, errors of the parameters generated due to the error of the reference voltage $V_{REF}$ or the circuit occurred during the calibration process can be reduced, so that the capacitance of the calibrated capacitor array 130 can be closer to the reference capacitor $C_{REF}$.

It should be noted that the compensation capacitors $C_1$-$C_N$ of the capacitor array 130 are formed by a single capacitor, and in another embodiment of the present invention, a relatively small capacitance of the compensation capacitors $C_1$-$C_N$ can also be implemented by connecting a plurality of capacitors in serial.

Figure 2B:
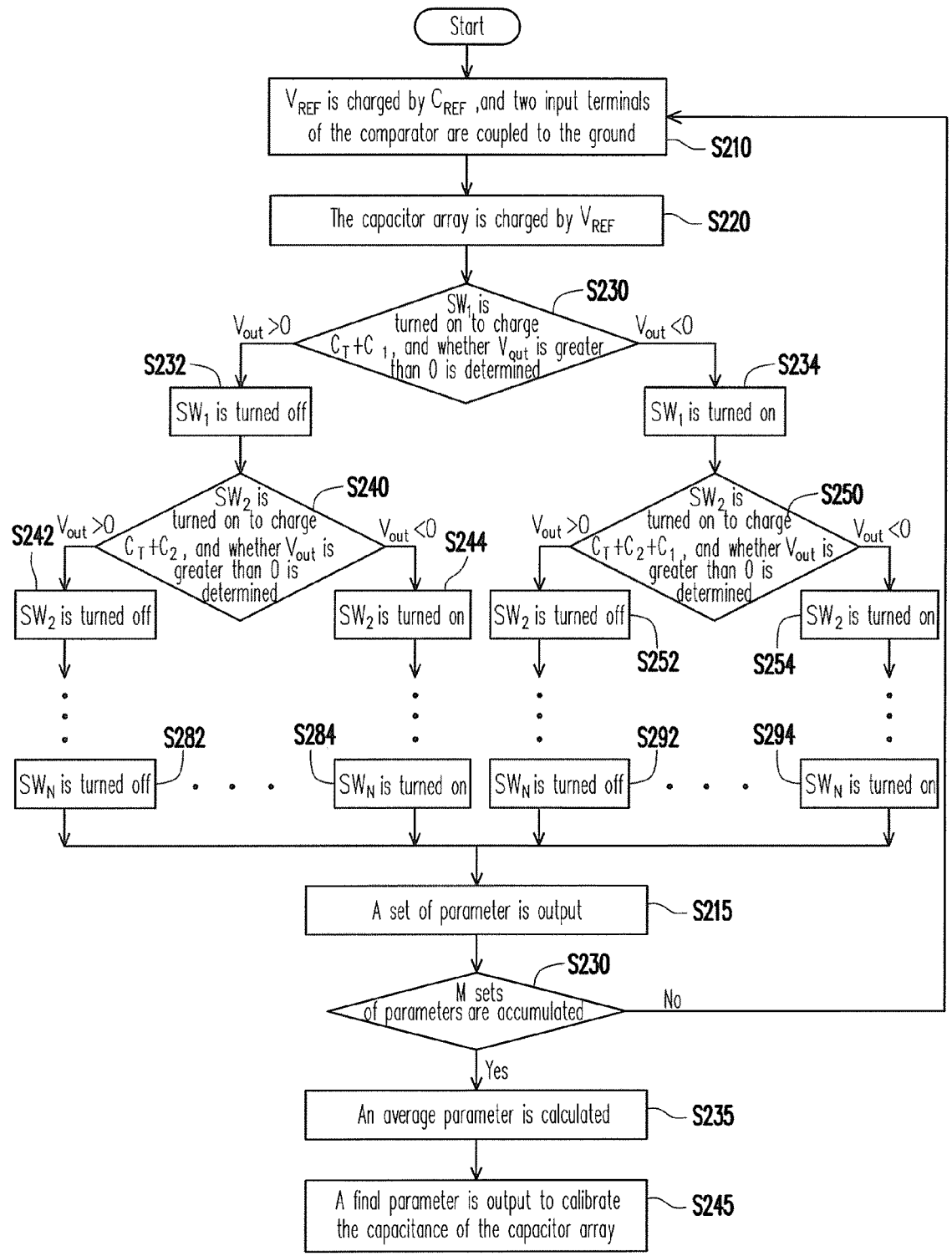
FIG. 2B is a flowchart illustrating a capacitor calibration procedure according to a first embodiment of the present invention.

Next, a flowchart is provided for describing the capacitor calibration procedure of the present embodiment. Referring to FIG. 2B, FIG. 2B is a flowchart illustrating a capacitor calibration procedure according to the first embodiment of the present invention. First, the reference capacitor $C_{REF}$ is charged by the reference voltage $V_{REF}$, and the positive and negative input terminals of the comparator 160 are coupled to the ground (step S210). Next, the switch $SW_{OP}$ is turned off, and the switches $SW_{P1}$-$SW_{P2}$ are switched to charge the capacitor array 130 by the reference voltage $V_{REF}$ (step S220). Next, the switch $SW_1$ is turned on to charge the target capacitor $C_T$ and the compensation capacitor $C_1$, and whether the output voltage $V_{OUT}$ is greater than 0 is determined, so as to determine the conducting state of the switch $SW_1$ (steps S232 and S234). If the output voltage $V_{OUT}$ is greater than 0, the switch $SW_1$ is turned off (step S232), and if the output voltage $V_{OUT}$ is smaller than 0, the switch $SW_1$ is turned on (step S234).

If the output voltage $V_{OUT}$ is greater than 0, it represents that the capacitance of the capacitor array 130 is greater than the capacitance of the reference capacitor $C_{REF}$, so that the compensation capacitor $C_2$ with a relatively small capacitance is coupled to the target capacitor $C_T$ in parallel. Then, whether a parallel connection relation between the compensation capacitor $C_2$ and the target capacitor $C_T$ is maintained is determined according to the output voltage $V_{OUT}$ (steps S240, S242 and S254). If the output voltage $V_{OUT}$ is smaller than 0, it represents that the capacitance of the capacitor array 130 is smaller than the capacitance of the reference capacitor $C_{REF}$, so that the next compensation capacitor $C_2$ is coupled to the target capacitor $C_T$ in parallel to increase the capacitance of the capacitor array 130. Thereafter, whether the parallel connection relation between the compensation capacitor $C_2$ and the target capacitor $C_T$ is maintained is also determined according to the output voltage $V_{OUT}$ (steps S250, S252 and S254). The other compensation capacitors are deduced by analogy to sequentially determine the conducting states of the corresponding switches $SW_1$-$SW_N$ until the capacitance of the capacitor array 130 is equal to the capacitance of the reference capacitor $C_{REF}$, or determinations of the conducting states of all of the switches $SW_1$-$SW_N$ are completed (steps S282, S284, S292 and S294).

After the conducting states of all of the switches $SW_1$-$SW_N$ are determined, the parameter corresponding to the conducting states of the switches $SW_1$-$SW_N$ is generated (step S215), and then the aforementioned steps are repeated for M times (M is a positive integer which can be determined by a designer) to generate M parameters, and the M parameters are accumulated (step S225). Next, an average of the parameters is calculated (step S235). Finally, a final parameter is output according to the average parameter, so as to calibrate the capacitance of the capacitor array 130 (step S245).

Second Embodiment

Figure 3:
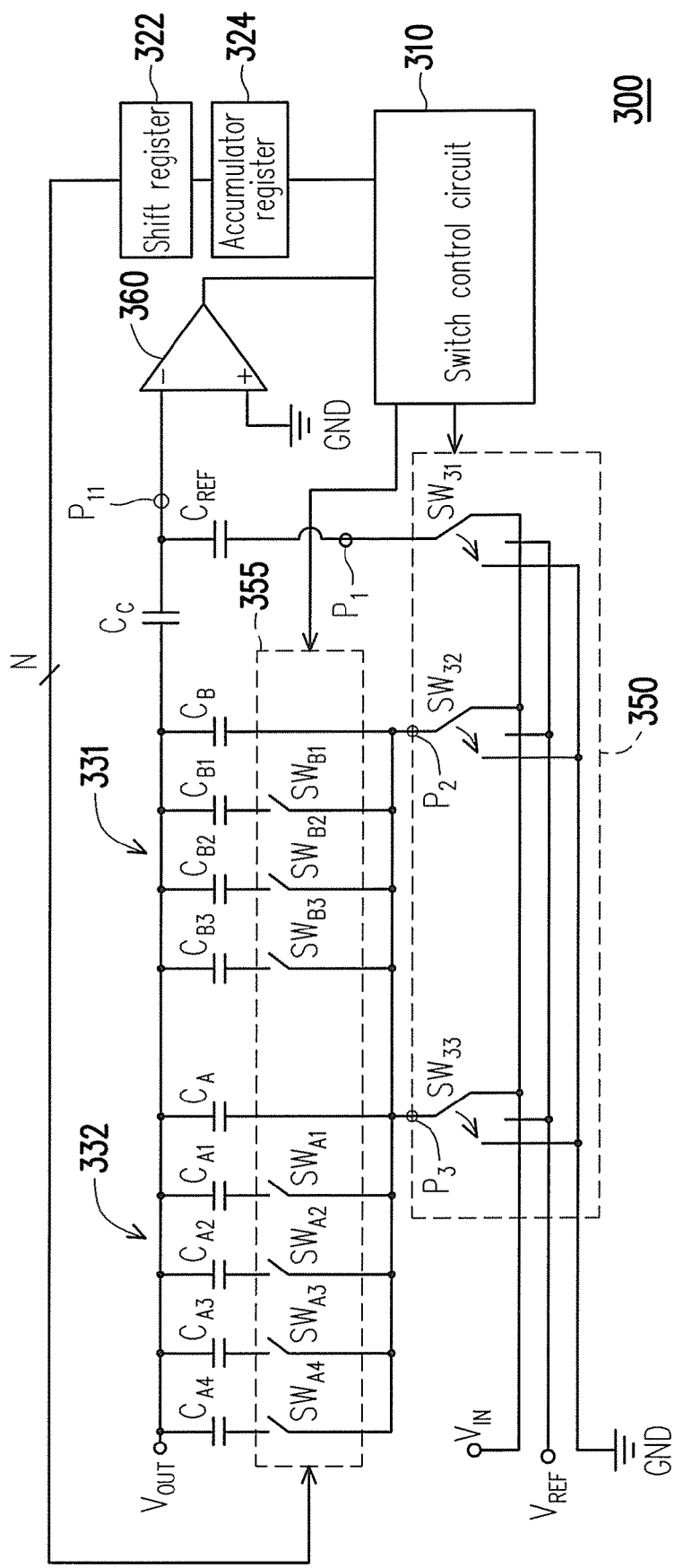
FIG. 3 is a diagram illustrating an approximation ADC according to a second embodiment of the present invention.

FIG. 3 is a diagram illustrating an approximation ADC according to the second embodiment of the present invention. The ADC 300 includes a shift register 322, an accumulator register 324, a switch control circuit 310, switch sets 350 and 355, a comparator 360, a reference capacitor $C_{REF}$ and capacitor arrays 331 and 332. The shift register 322 and the accumulator register 324 are coupled between the switch control circuit 310 and the capacitor arrays 331 and 332. The switch control circuit 310 is further coupled to the switch sets 350 and 355 for controlling switches therein. The switch set 350 includes switches $SW_{31}$, $SW_{32}$ and $SW_{33}$, and one ends thereof are respectively coupled to a first input terminal $P_1$, a second input terminal $P_2$ and a third input terminal $P_3$, and other ends thereof are selectively coupled to an input voltage $V_{IN}$, a reference voltage $V_{REF}$ or the ground GND. The other ends of the first input terminal $P_1$, the second input terminal $P_2$ and the third input terminal $P_3$ are respectively coupled to the reference capacitor $C_{REF}$, and the capacitor arrays 331 and 332. A negative input terminal of the comparator 360 is coupled to the common terminal $P_{11}$, and a positive input terminal of the comparator 360 is coupled to the ground GND. A main difference between the ADC 300 and FIG. 1 is that the ADC 300 include two capacitor arrays 331 and 332, and a capacitor $C_C$, wherein the capacitor $C_C$ is used for reducing the capacitances of the capacitor arrays 331 and 332, and a match layout between a capacitance of the capacitor $C_C$ and other capacitors cannot be implemented, so that a relatively great error of the capacitor $C_C$ can be generated. Therefore, the capacitor calibration has to be performed to the capacitors $C_A$ and $C_B$.

The capacitor calibration flow of the first embodiment is applied for calibrating the target capacitors $C_A$ and $C_B$. First, the target capacitor $C_B$ is calibrated, and the compensation capacitors $C_{B1}$-$C_{B3}$ are used for calibrating the target capacitor $C_B$. The switch control circuit 310 first charges the reference capacitor $C_{REF}$, and then charges the capacitor array 331, and the conducting states of the switches $SW_{B1}$-$SW_{B3}$ are adjusted according to a voltage variation of the common terminal $P_{11}$. After the capacitor $C_B$ is calibrated, the capacitor $C_A$ is calibrated according to the same method. Since a capacitance of the capacitor $C_A$ is twice the bigger than that of the capacitor $C_B$, there are four compensation capacitors $C_{A1}$-$C_{A4}$. The capacitances of the compensation capacitors $C_{B1}$-$C_{B3}$ and the compensation capacitors $C_{A1}$-$C_{A4}$ are determined according to a fabrication error and the capacitances of the capacitors $C_A$ and $C_B$, though the present invention is not limited thereto. In the present embodiment, the compensation capacitors $C_{B1}$-$C_{B3}$ and the compensation capacitors $C_{A1}$-$C_{A4}$ are set according to the binary-weighted approach as that does of the compensation capacitors $C_1$-$C_N$ of the first embodiment, wherein the capacitances of the compensation capacitors in an individual array are increased in multiples.

After multiple calibrations are completed, the accumulator register 324 records the parameters corresponding to the conducting states of the switches $SW_{A1}$-$SW_{A4}$ and $SW_{B1}$-$SW_{B3}$, and an average of the parameters is calculated by the shift register 322. Then, the conducting states of the switches $SW_{A1}$-$SW_{A4}$ and $SW_{B1}$-$SW_{B3}$ are determined according to the average parameter (i.e. the final parameter). After the multiple self-calibrations, the error generated during the calibration process can be reduced, so that the capacitances of the capacitor arrays 331 and 332 can further approximate to the capacitance of the reference capacitor $C_{REF}$. Thereafter, the switch set 350 is coupled to the input voltage $V_{IN}$ to perform an analog to digital conversion. Moreover, it should be noted that in the present embodiment, a plurality of capacitor arrays can be applied, so that the present embodiment is not limited to the capacitor arrays 331 and 332 of FIG. 3, and a number of the compensation capacitors in the capacitor array is also not limited to that shown in FIG. 3. In addition, the capacitor $C_C$ is mainly used for reducing the capacitance of the capacitor array located at a back-end, and in another embodiment of the present invention, the capacitor $C_C$ can be omitted. In the ADC, the capacitor array with relatively low bit can be used as the reference capacitor to calibrate the capacitor array with relatively high bit, or a calibrated capacitor array can be used for calibrating an un-calibrated capacitor array.

Third Embodiment

Figure 4:
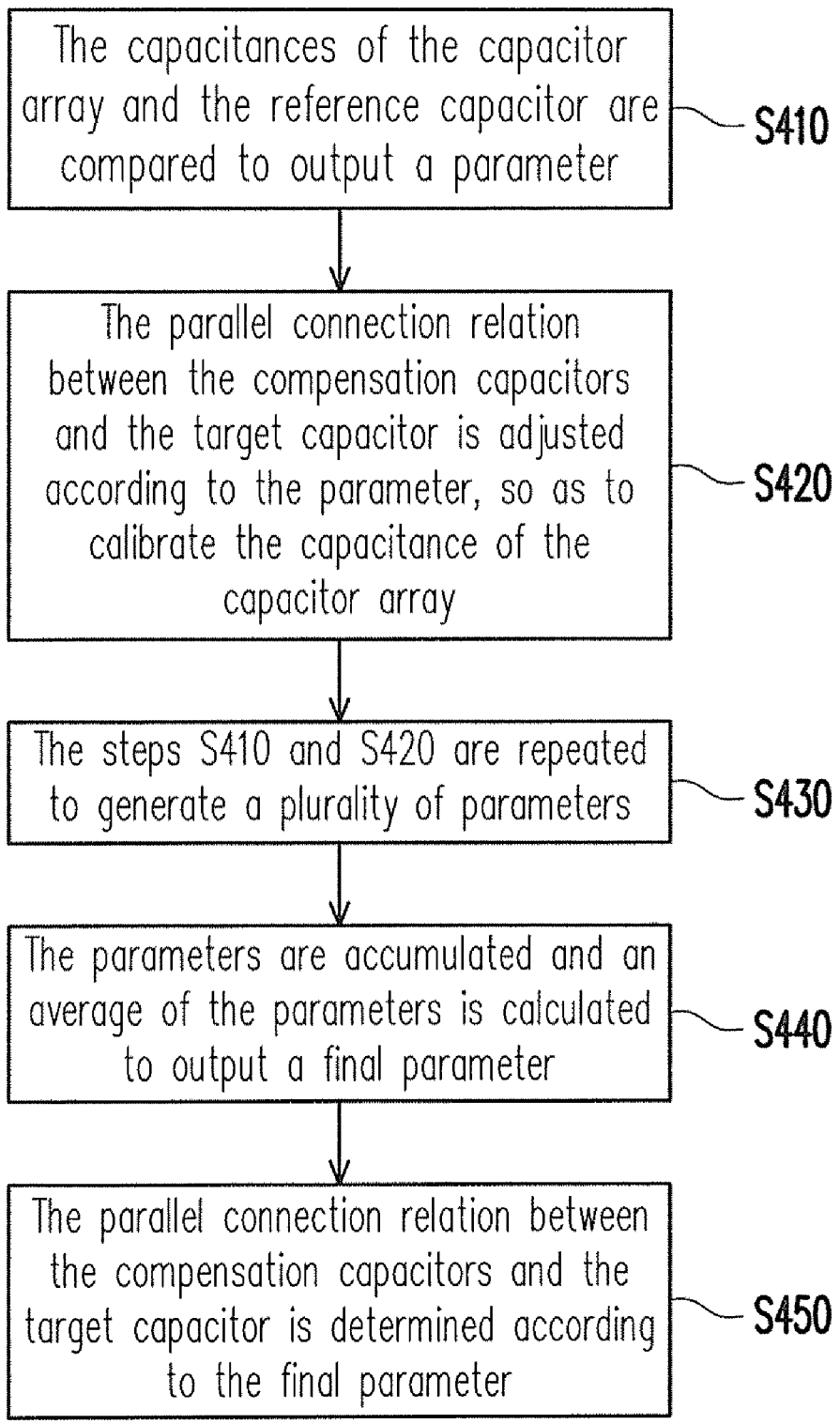
FIG. 4 is a flowchart illustrating a self-calibration method for capacitors according to a third embodiment of the present invention.

According to another aspect, the present invention provides a self-calibration method for capacitors, by which the error generated during the calibration process can be reduced by multiple self-calibration procedures. Referring to FIG. 4, FIG. 4 is a flowchart illustrating a self-calibration method for capacitors according to the third embodiment of the present invention. First, the capacitances of the capacitor array and the reference capacitor are compared to output a parameter (step S410). Next, the parallel connection relation between the compensation capacitor and the target capacitor is adjusted according to the parameter, so as to calibrate the capacitance of the capacitor array (step S420). Next, the steps S410 and S420 are repeated to generate a plurality of parameters (step S430). Next, the parameters are accumulated and an average of the parameters is calculated to output a final parameter (step S440). Finally, the parallel connection relation between the compensation capacitor and the target capacitor is determined according to the final parameter (step S450). The final parameter is the average parameter of multiple self-calibrations, and the parallel connection relation between the compensation capacitor and the target capacitor is determined according to the average parameter, so as to reduce an error generated during the calibration process, and the capacitance of the capacitor array can further approximate to the capacitance of the reference capacitor.

In summary, the capacitance of the capacitor array is calibrated according to the average parameter generated based on multiple self-calibrations, so as to reduce the error generated during the calibration process. Moreover, the accumulator register and the shift register are applied in the self-calibration circuit, so that the self-calibration circuit can automatically accumulate the parameters and calculate the average parameter.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A self-calibration circuit for capacitors, comprising:
    a reference capacitor, coupled between a common terminal and a first input terminal;
    a capacitor array, comprising:
        a target capacitor, coupled between the common terminal and a second input terminal; and
        a plurality of compensation capacitors, one ends of the compensation capacitors being coupled to the common terminal, and other ends of the compensation capacitors being coupled to a first switch set, wherein the first switch set has a plurality of first switches respectively coupled between the compensation capacitors and the second input terminal;
    a calibration circuit, coupled to the reference capacitor and the capacitor array, and the calibration circuit comparing capacitances of the reference capacitor and the capacitor array to generate a parameter for determining conducting states of the first switches of the first switch set, so as to adjust a parallel connection relation between the compensation capacitors and the target capacitor for calibrating the capacitance of the capacitor array;
    a counting unit, coupled to the calibration circuit and the first switch set, for temporarily store the parameters corresponding to the conducting states of the first switches,
    wherein the calibration circuit repeatedly compares the capacitances of the reference capacitor and the capacitor array to generate a plurality of parameters, and the counting unit accumulates the parameters and calculates an average of the parameters to output a final parameter, so as to determine the conducting states of the first switches of the first switch set for calibrating the capacitance of the capacitor array.

2. The self-calibration circuit for capacitors as claimed in claim 1, wherein the calibration circuit comprises:
    a comparator, having a positive input terminal coupled to ground, and a negative input terminal coupled to the common terminal;
    a second switch, coupled between the positive input terminal and the negative input terminal of the comparator;
    a second switch set, coupled among the first input terminal, the second input terminal, a reference voltage and the ground; and
    a switch control circuit, coupled to an output terminal of the comparator, the second switch, the first switch set and the second switch set, for controlling the second switch, the first switch set and the second switch set,
    wherein the switch control circuit generates the parameters corresponding to the conducting states of the first switches according to outputs of the comparator, so as to calibrate the capacitance of the capacitor array.

3. The self-calibration circuit for capacitors as claimed in claim 2, wherein the second switch set comprises:
    a third switch, for coupling the first input terminal to the reference voltage or the ground selectively; and
    a fourth switch, for coupling the second input terminal to the reference voltage or the ground selectively.

4. The self-calibration circuit for capacitors as claimed in claim 3, wherein the self-calibration circuit generates the parameter according to steps comprising:
    turning on the first switch to couple the positive input terminal and the negative input terminal of the comparator to the ground, and switching the second switch set to couple the first input terminal to the reference voltage for charging the reference capacitor, and couple the second input terminal to the ground;
    turning off the first switch to form an open circuit, and switching the second switch set to couple the first input terminal to the ground, and couple the second input terminal to the reference voltage for charging the target capacitor; and
    sequentially determining the conducting states of the first switches according to the outputs of the comparator, so as to adjust a parallel connection relation of the compensation capacitors and the target capacitor.

5. The self-calibration circuit for capacitors as claimed in claim 2, wherein the counting unit comprises:
    an accumulator register, coupled to the switch control circuit, for accumulating the parameters; and
    a shift register, coupled between the accumulator register and the first switch set, for calculating the average of the parameters, so as to output the final parameter.

6. The self-calibration circuit for capacitors as claimed in claim 3, wherein a data formation of the parameter is binary, and bits of the parameter correspond to the conducting states of the first switches respectively.

7. The self-calibration circuit for capacitors as claimed in claim 1, wherein the capacitances of the compensation capacitors are $2^i*C$, wherein i is an index value of the compensation capacitors, and i is a positive integer satisfying $0\leq i\leq(N-1)$, wherein N represents a number of the compensation capacitors, and C is a minimum capacitance in the compensation capacitors.

8. A self-calibration method for capacitors, for calibrating a capacitor array, so that a capacitance of the capacitor array approximates to a capacitance of a reference capacitor, the capacitor array comprising a target capacitor and a plurality of compensation capacitors, and the method comprising:
(a) comparing capacitances of the capacitor array and the reference capacitor to output a parameter;
(b) adjusting a parallel connection relation between the compensation capacitors and the target capacitor according to the parameter, so as to calibrate the capacitance of the capacitor array;
(c) repeating the steps (a) and (b) to generate a plurality of parameters;
(d) accumulating the parameters and calculating an average of the parameters to output a final parameter; and
(e) determining the parallel connection relation between the compensation capacitors and the target capacitor according to the final parameter.

9. The self-calibration method for capacitors as claimed in claim 8, wherein the capacitances of the compensation capacitors are $2^i*C$, wherein i is an index value of the compensation capacitors, and i is a positive integer satisfying $0\leq i\leq(N-1)$, wherein N represents a number of the compensation capacitors, and C is a minimum capacitance in the compensation capacitors.

* * * * *